(12) United States Patent
Lai et al.

(10) Patent No.: US 7,830,241 B2
(45) Date of Patent: Nov. 9, 2010

(54) FILM RESISTOR EMBEDDED IN MULTI-LAYER CIRCUIT BOARD AND MANUFACTURING METHOD THEREOF

(75) Inventors: Ying-Jiunn Lai, Jiadong Township, Pingtung County (TW); Chin-Sun Shyu, Won-Dun Township, Pingtung County (TW); Chang-Sheng Chen, Taipei (TW); Uei-Ming Jow, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 352 days.

(21) Appl. No.: 11/485,785

(22) Filed: Jul. 12, 2006

(65) Prior Publication Data

US 2007/0222551 A1    Sep. 27, 2007

(30) Foreign Application Priority Data

Mar. 21, 2006    (TW) .............................. 95109606 A

(51) Int. Cl.
*H01C 1/012* (2006.01)
(52) U.S. Cl. .................................................... 338/307
(58) Field of Classification Search .................. 338/307
See application file for complete search history.

(56) References Cited

U.S. PATENT DOCUMENTS 4,777,718 A * 10/1988 Henderson et al. ............ 29/620
4,899,126 A    2/1990  Yamada ....................... 338/309
5,990,421 A   11/1999  Yee ............................. 174/260
5,994,997 A   11/1999  Brown et al. ................. 338/308
6,130,601 A   10/2000  Brown et al. ................. 338/307
6,284,982 B1   9/2001  Kusner et al. ................ 174/255

FOREIGN PATENT DOCUMENTS

| JP | 2004-311628 | 11/2004 |
| TW | 503681 | 9/2002 |
| TW | 551016 | 9/2003 |
| TW | 560230 | 11/2003 |

* cited by examiner

*Primary Examiner*—Elvin G Enad
*Assistant Examiner*—Joselito Baisa
(74) *Attorney, Agent, or Firm*—J.C. Patents

(57) ABSTRACT

A resistor structure embedded in a multi-layer circuit board and manufacturing method thereof are provided. Resistive material is coated on any layer among the multi-layer circuit board, and two symmetric electrodes are formed in the geometric center of the resistive material area. The two electrodes are disposed in the resistive material layer and are covered by the resistive material. And the two electrodes are led out from respective bores at the central position of the resistive electrodes, for connecting to any other metal layer. This resistor structure can avoid the unstable resistance when the coated resistor is operated at high frequency, and also avoid the formation untrimmed edges during coating that affects the precision of resistance.

21 Claims, 8 Drawing Sheets

FILM RESISTOR EMBEDDED IN MULTI-LAYER CIRCUIT BOARD AND MANUFACTURING METHOD THEREOF

CROSS-REFERENCE TO RELATED APPLICATION

This application claims the priority benefit of Taiwan application serial no. 95109606, filed on Mar. 21, 2006. All disclosure of the Taiwan application is incorporated herein by reference.

BACKGROUND OF THE INVENTION

1. Field of the Invention

The present invention relates to a film resistor embedded in a multi-layer circuit board and manufacturing method thereof, and more particularly, to a film resistor embedded in a multi-layer circuit board and the manufacturing method thereof that can avoid untrimmed edges of resistive materials during coating, and can improve the stability of the resistance when the film resistor is operated in high frequency.

2. Description of Related Art

Resistors are widely applied in circuits such as a current limiting circuit, a voltage regulating circuit and a high-frequency terminal impedance control circuit. In general, most miniature resistors are welded with the surface mounting technique (SMT) process. Though the resistor becomes increasingly miniature, it has to be placed on the surface of the multi-layer substrate, which increases the physical surface area and height of the circuit. To embed the resistor in the circuit board, many material developers have developed resistors coatings and applied them in various electronic circuits in recent years. However, the coated resistors often have untrimmed edges during screen printing, which causes the resistance drift, such that the resistance of the resistors after coating needs to be finely tuned with high-precision laser tools or sand-blasting grinders, which is time consuming and needs additional equipment. Furthermore, the resistance of resistors used in high-frequency circuits has to be stable and not change with the frequency.

After the normal commercial thick film resistor (TFRs) ink is coated on the substrate, the resistance thereof has the variation of about ±20% due to the unevenness in geometric structure. To obtain the precise resistance, TFR has to be trimmed with the following two methods after being sintered: (1) sand blasting grinding, and (2) laser trimming. However, the aforementioned trimming methods of the resistors are only applicable to the trimming of the coated resistors on the surface of the substrate, and extra processing equipment and cost are needed to obtain high-precision coated resistors. As for various resistors used in high-frequency applications, the resistance drift still occurs with the change of the frequency. Therefore, it is still necessary to improve the original resistor structure, so as to obtain stable resistance performance.

U.S. Pat. No. 5,990,421 entitled "Built in Board Resistors" discloses a built-in resistor as shown in FIG. 1. This patent defines the coplanar power plane or ground plane on the surface conductive layer on the multi-layer circuit board 16, such as the top conductive plane 22 or the bottom conductive plane 20 as shown, and coats resistive material 32 on the surface to form the resistor. The periphery of the coating area of the resistive material is the power plane or the ground plane, so as to form one electrode of the dual-electrode resistor. The other electrode of the dual-electrode resistor is formed by connecting the interior of the coating area of the resistive material and a signal line 26 of the inner layer through a via 28. The two electrodes are isolated with an isolation area 30 having a through hole.

In addition, U.S. Pat. No. 5,994,997 entitled "Thick-Film Resistor having Concentric Terminals and Method Therefor", as shown in FIGS. 2A and 2B, discloses a structure similar to that of the previous patent (U.S. Pat. No. 5,990,421). FIG. 2A is a top view of a film resistor 200, and FIG. 2B is a side view of the film resistor 200. The resistive material layer of the resistor is 210, and the electrodes of the resistor are respectively an inner electrode 212 and an outer electrode 214. The inner electrode 212 is connected to a wire 220 through a bore 216, and is connected to a layer 230 as the outer electrode 218 through a bore 222. The structure of the patent mainly involves the resistor structure of the concentric ring electrode.

In addition, U.S. Pat. No. 6,284,982 entitled "Method and Component for Forming an Embedded Resistor in a Multi-Layer Printed Circuit" is shown in FIGS. 3A and 3B. The patent includes two major structures. One major structure is an inner core 300 composed by the multi-layer printed circuit board structure, and many leads or connectors 310 interconnecting with each other are provided in the inner core 300, which are isolated by a media layer 312 and is formed by using laminating structures 320. The other major structure is a film substrate including a polymeric film 330 and an adhesive layer 340. The main application of the film substrate 330 is designing the film resistor. Resistive material 344 is coated in an area 342, and the resistive electrode is led out from a through hole 346, and is connected to any position through a line 360 of a metal layer 350. However, it is only disclosed in this patent that the resistive material 344 is coated in the area 342, and the resistive electrode is led out from the through hole 346 at one end of said discrete area. This patent doesn't illustrate the resistive material, the resistive electrodes and the structure, and the resistive substrate is only limited to the structure of the aforementioned film substrate 330 and 340; therefore, the embedded resistor cannot be used in the required layer of the multi-layer substrate structure.

SUMMARY OF THE INVENTION

The present invention provides a resistor wherein the electrodes may be led out from the center in any layer of a multi-layer substrate structure, and thereby reduce the possibility of formation of untrimmed edges during the coating of the resistive material, and thus avoid the effects thereof and improve the stability of the resistor when the resistor is operated in high-frequency.

In one embodiment of the present invention, an embedded film resistor applicable for the multi-layer circuit board is provided. The film resistor includes a resistive material area and two electrodes. The resistive material area is formed by coating the resistive material on one substrate layer among the multi-layer circuit board. The two electrodes are independently disposed in the resistive material layer, and are totally covered by the resistive material. The two electrodes are led out from respective bores at the centers of the electrodes, and are connected to any other metal layer.

In another embodiment of the present invention, a method for manufacturing the embedded film resistor applicable for the multi-layer circuit board is provided. The method includes the following steps. Two electrodes are formed in one substrate layer among the multi-layer circuit board. The resistive material is coated in the substrate layer to form a resistive material area, wherein the resistive material covers the two electrodes. Next, at least two bores are formed to expose the two electrodes respectively. A conductive material is filled in the bores to respectively connect to any metal layer of the other substrate layers among the multi-layer circuit layer.

In the aforementioned embedded film or the method thereof, two electrodes are symmetric and are disposed in the geometric center of the resistive material area.

In the aforementioned embedded film or the method thereof, each of the two electrodes has a via or a through hole. The two electrodes are led out from the conductive through hole at the central positions of the electrodes, and are connected to any other metal layer.

In order to make the aforementioned and other objects, features and advantages of the present invention comprehensible, preferred embodiments accompanied with figures are described in detail below.

DESCRIPTION OF EMBODIMENTS

Figure 1:
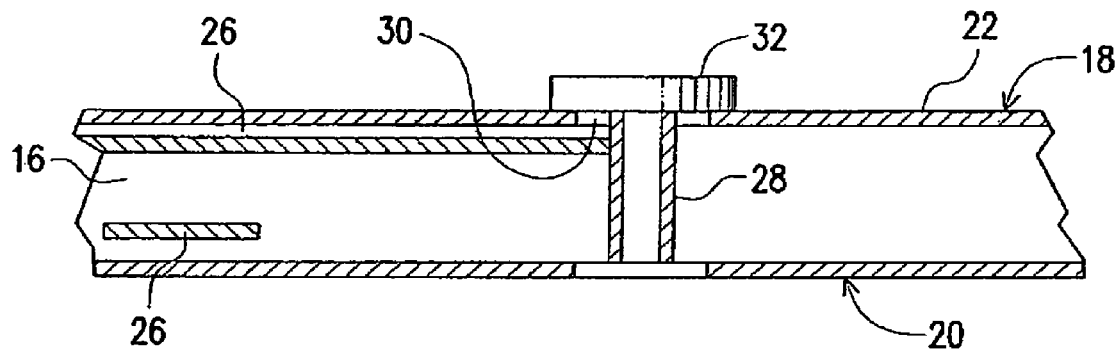
FIG. 1 is a schematic sectional view of a conventional built-in resistor.
Figure 2A:
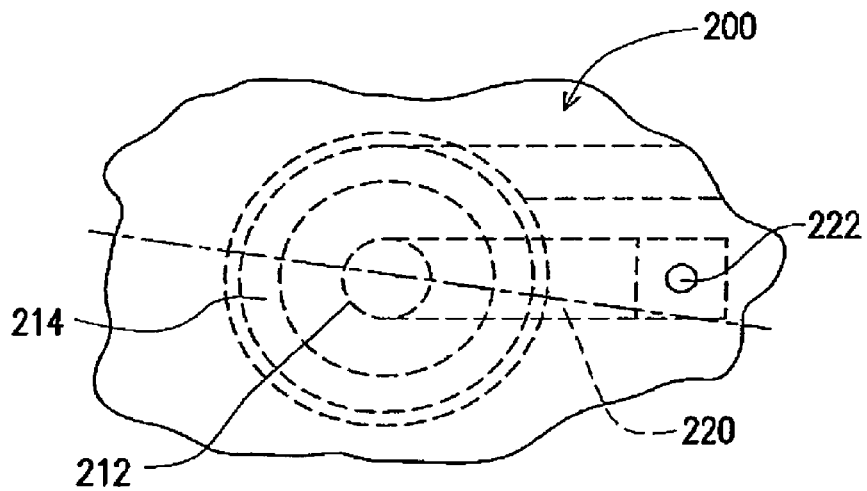
FIGS. 2A and 2B are respectively a top view and a side view of a conventional film resistor.
Figure 2B:
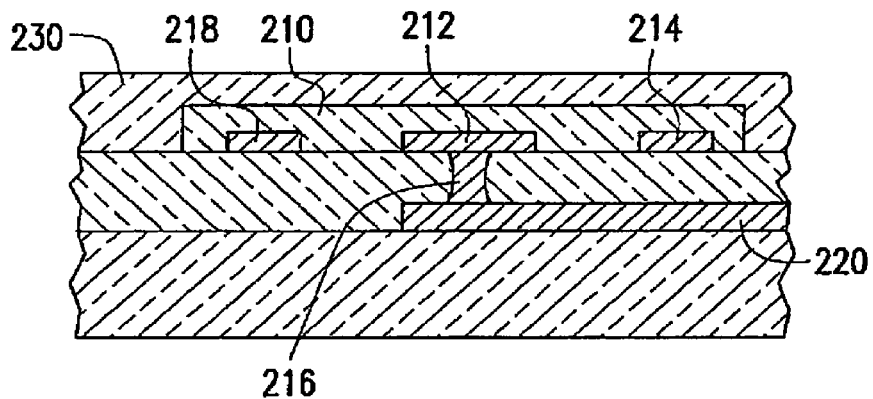
Figure 3A:
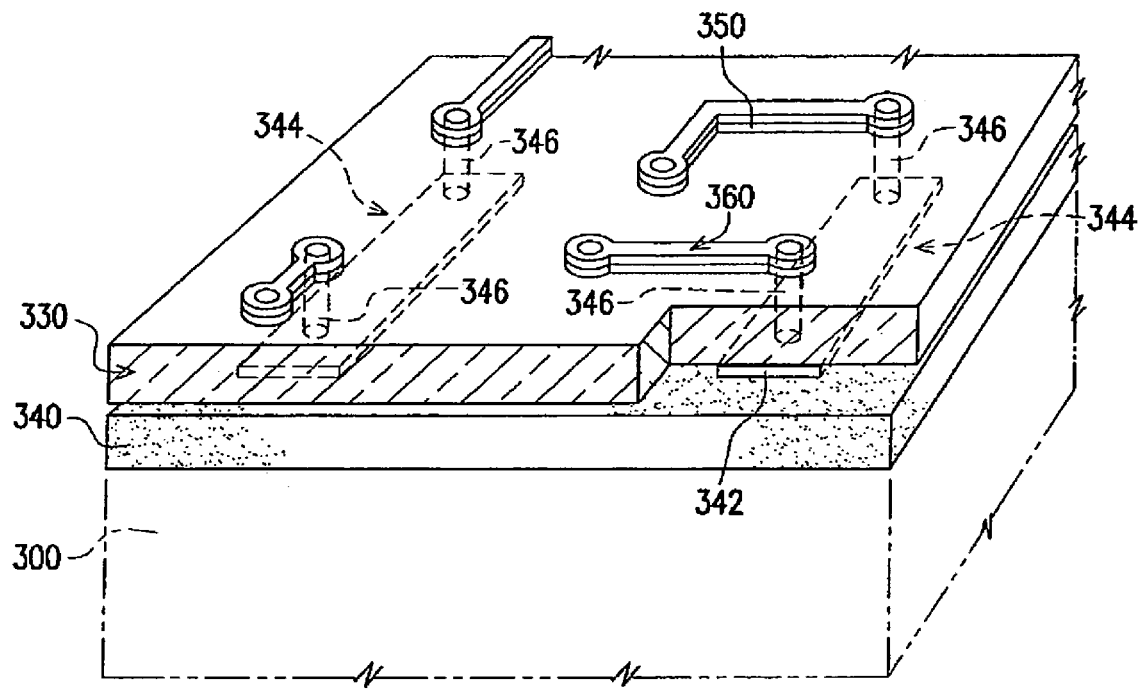
FIGS. 3A and 3B are schematic views of a conventional multi-layer printed circuit board.
Figure 3B:
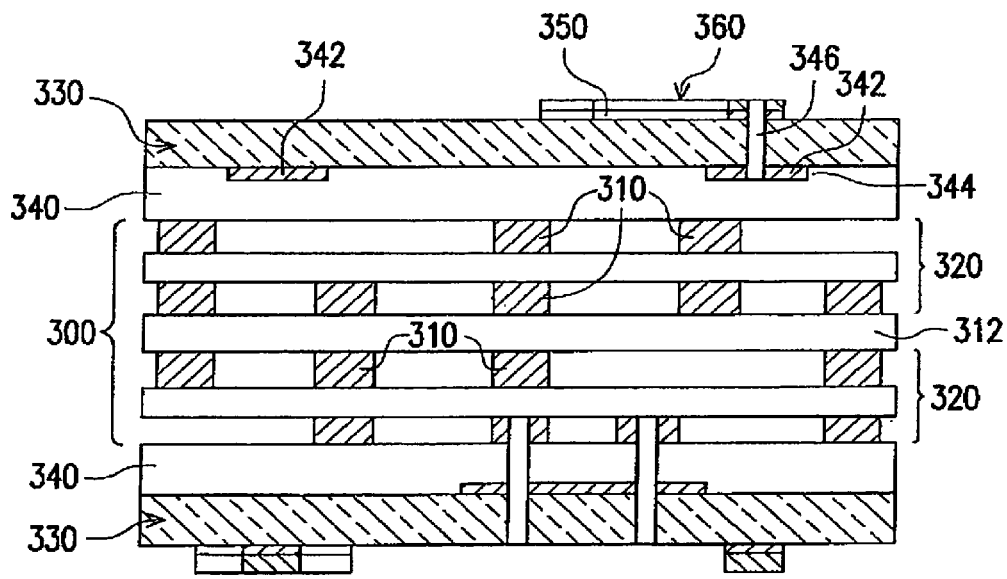
Figure 4A:
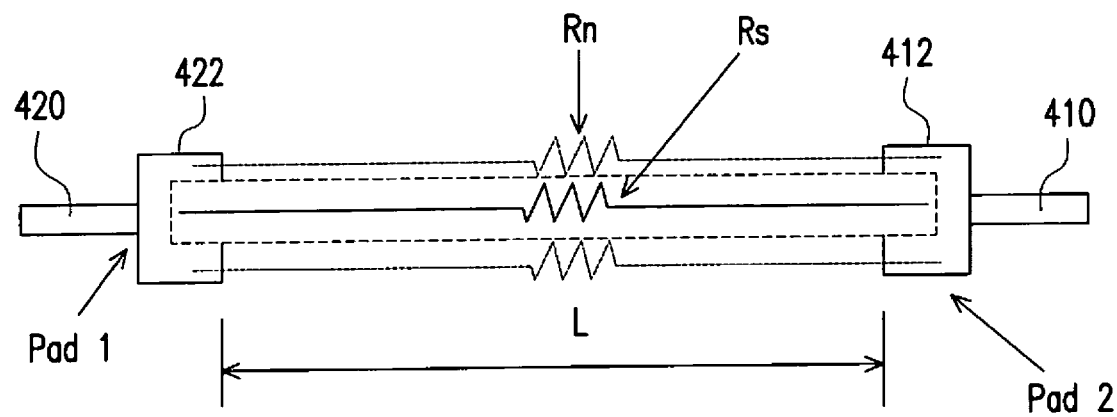
FIG. 4A is a schematic view of a coated film resistor structure formed between resistor connection ports.

The resistance formula for ideal resistors is $R=\rho*L/A$. According to this formula, the resistance of a resistor is directly proportional to the coefficient of resistance and the resistance length L, and is inversely proportional to the sectional area A of the resistor structure. Assuming the resistive material and the sectional area of a film resistor are constant, the resistance variation of two electrodes of the resistor is determined by the length that the current flows in the resistive material. However, unexpected resistance variation often occurs due to untrimmed edges on the periphery of the resistive material for the coated film resistors in practical applications. As shown in FIG. 4A, two resistor connection ports 410 and 420 are respectively connected to resistive pads 412 and 422, between which is the coated film resistive material. As untrimmed edges are generated on the periphery of the resistive material, unexpected resistance, i.e., the resistance Rn as shown in the drawing, is generated besides the predetermined resistance Rs. The unexpected resistance Rn is generated due to the untrimmed edges on the periphery of the resistive material.

Figure 4B:
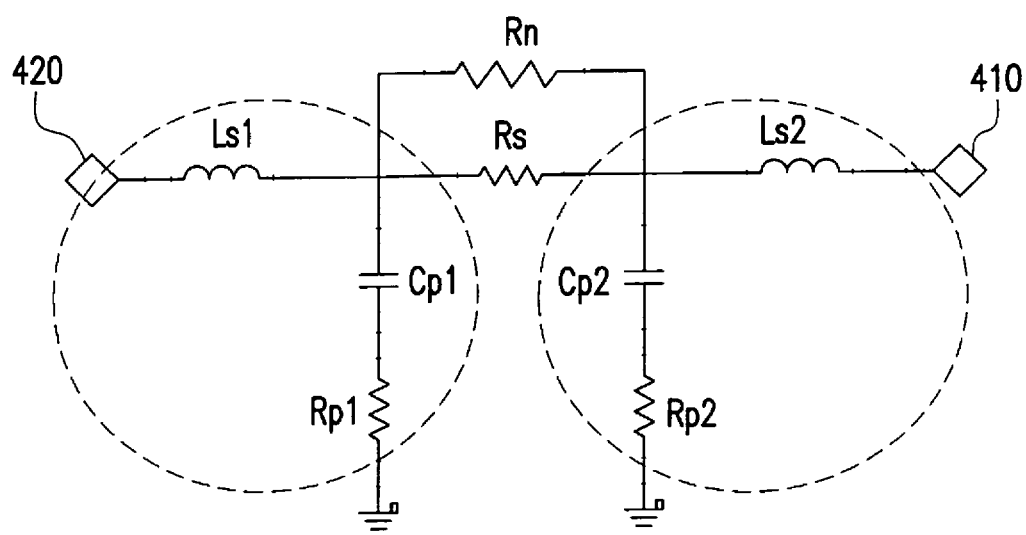
FIG. 4B is a schematic view of an equivalent circuit of the coated film resistor structure of FIG. 4A.

Moreover, as the resistive pads 412 and 422 are over large, parasitic components are generated. FIG. 4B shows the equivalent circuit diagram of the parasitic components. The parasitic components include parasitic capacitors Cp1 and Cp2, parasitic inductors Ls1 and Ls2, and parasitic resistors Rp1 and Rp2, which make the applied frequency of the coated film resistor unable to obtain stable high-frequency features.

The present invention provides a resistor with electrodes led out from the center used in any layer of a multi-layer substrate structure. The resistive electrodes of the resistor are covered by the resistive material, so the structure of the component can avoid the effect of untrimmed edges during the coating of the resistive material, and at the same time can improve the stability of the resistor when the resistor is operated in high-frequency.

Figure 5A:
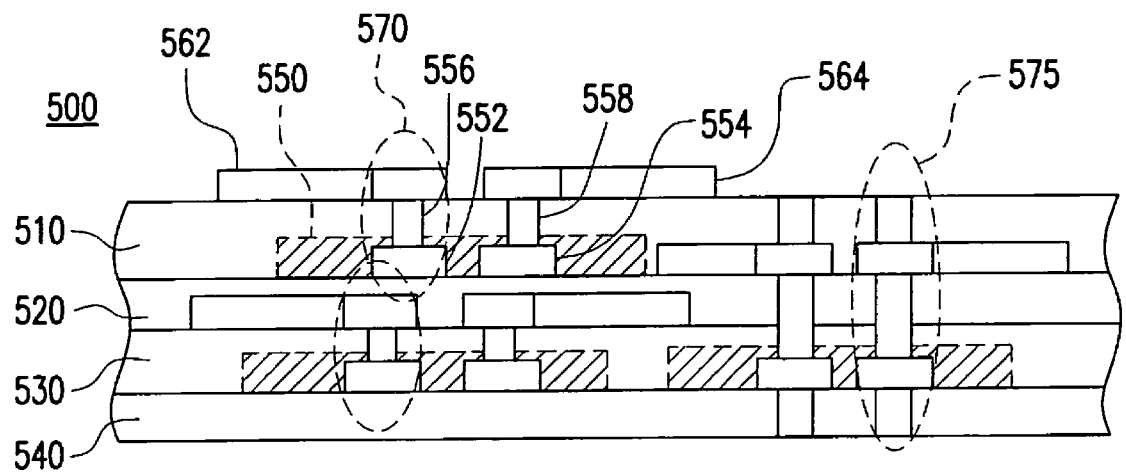
FIG. 5A is a schematic view of a multi-layer circuit board structure with the film resistor design according to a preferred embodiment of the present invention.

Referring to FIG. 5A, a multi-layer circuit board structure with the film resistor design according to a preferred embodiment of the present invention is shown. According to the present invention, in any layer 510~540 of the multi-layer circuit board structure 500, the dual-electrode film resistor is designed as the structure as shown in the drawing. Two independent electrodes are led out from laser vias or through holes near the geometric center of the resistive material, so as to form an embedded dual-electrode resistor structure. Take the dual-electrode film resistor 550 as an example, leading out of an independent electrode in a manner of laser vias is marked by reference number 570. Two electrodes 552 and 554 are disposed near the geometric center of the dual-electrode film resistor 550, and are connected to other conductive layers 562 and 564 through vias 556 and 558. In addition to being disposed near the geometric center of the dual-electrode film resistor 550, the two electrodes 552 and 554 are covered by the resistive material. The leading out of an independent electrode in manner of a through hole is marked by numeral 575.

The electrodes 552 and 554 defined here are disposed near the geometric center of the resistive material, i.e., the geometric center of the structure of the dual-electrode film resistor 550. The central point between the two electrodes 552 and 554 is just or near the geometric center of the dual-electrode film resistor 550, and the two electrodes are disposed symmetrically. FIG. 5C shows a top view of the dual-electrode film resistor 550, and FIG. 5D shows a side view of the dual-electrode film resistor 550 from another angle. As can be clearly seen that the electrodes 552 and 554 are covered by the resistive material, and the electrodes 552 and 554 are symmetrically disposed near the geometric center of the dual-electrode film resistor 550, and are connected to the outside through the vias 556 and 558.

Figure 5B:
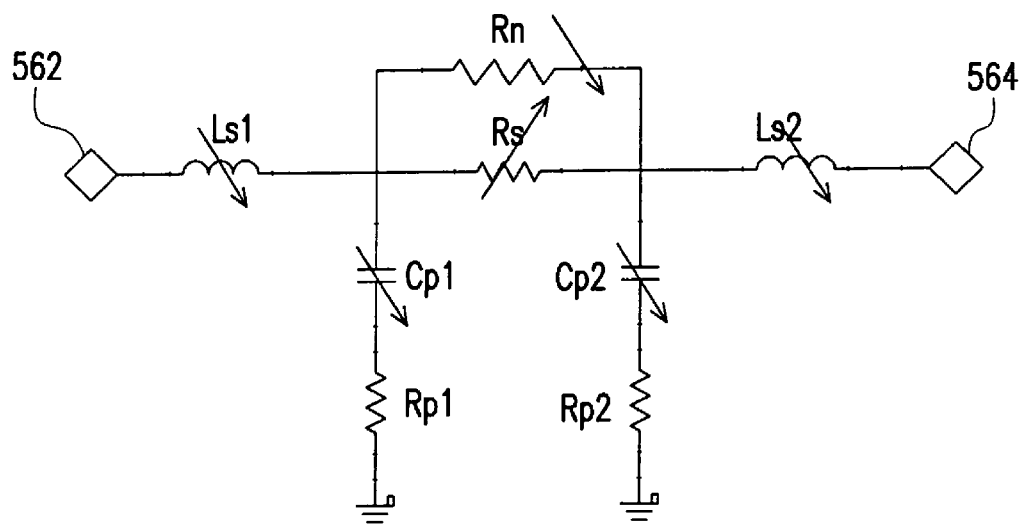
FIG. 5B is a schematic view of an equivalent circuit of the multi-layer circuit board structure with the film resistor design of FIG. 5A.
Figure 5C:
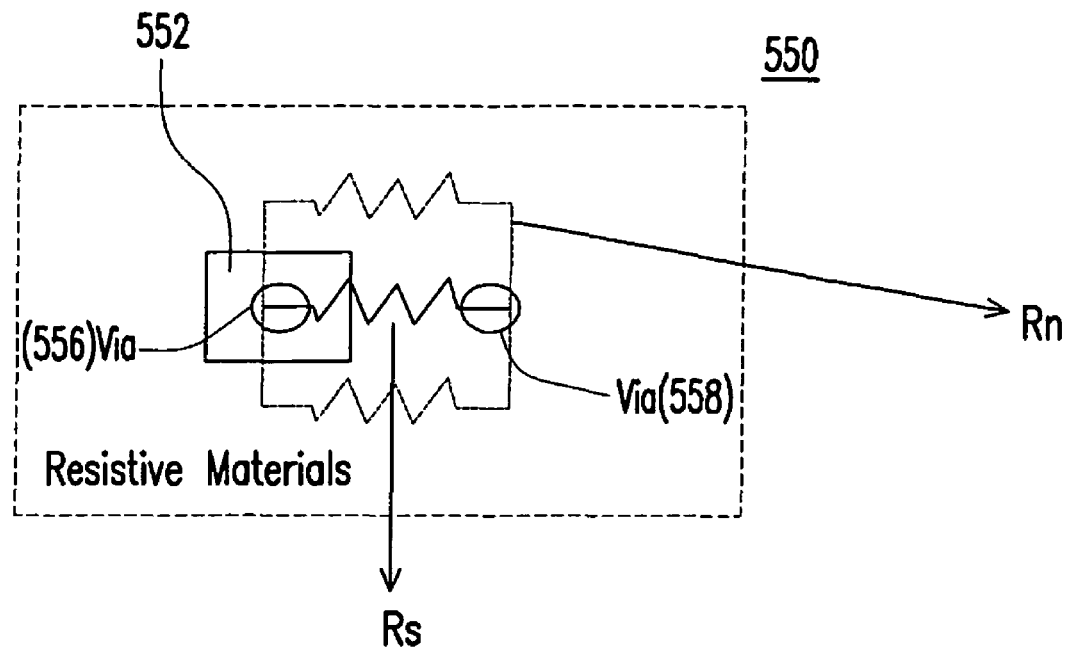
FIG. 5C is a top view of the dual-electrode film resistor shown in FIG. 5A.
Figure 5D:
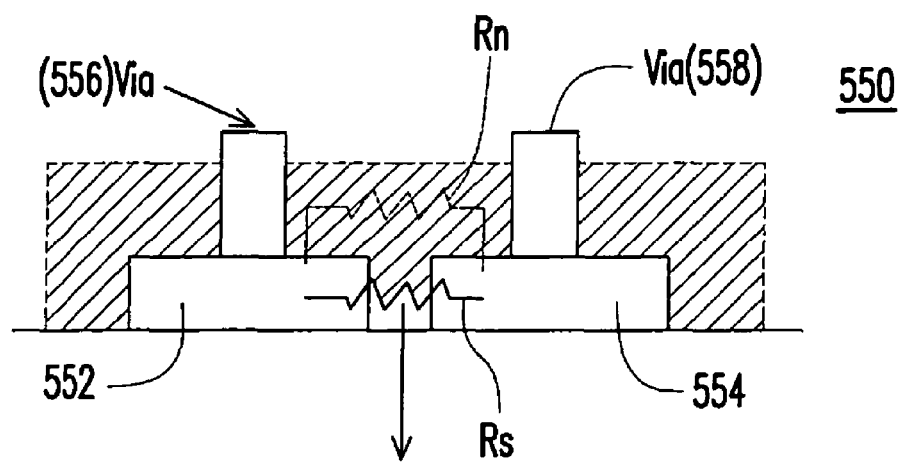
FIG. 5D is a side view of the dual-electrode film resistor shown in FIG. 5A.

Furthermore, as can be seen from the equivalent circuit of the dual-electrode film resistor 550 as shown in FIG. 5B, the two resistive electrodes 552 and 554 are covered by the resistive material. Assuming that the straight path resistor between the two electrodes 552 and 554 is Rs, and the resistor caused by the periphery of the resistive material or the untrimmed edges is Rn, since the current path caused by Rn resistor is long, the resistance thereof is much greater than the resistance of Rs. According to the parallel connection effect of resistors, the resistance between the two resistive electrodes is mainly determined by Rs, thus this resistor structure reduces the resistance error caused by untrimmed edges of the resistive material generated during the coating.

As the equivalent circuit in FIG. 5B shows, parasitic components between two resistor connection ports 562 and 564 are parasitic capacitors Cp1 and Cp2, parasitic inductors Ls1 and Ls2, and parasitic resistors Rp1 and Rp2. However, the resistive electrode structure provided in the embodiment of the present invention is applied in the resistive material, and the electrodes are led out from vias at the center of the electrodes, thus smaller parasitic components can be obtained. The size of the parasitic resistors Cp1 and Cp2, the parasitic inductors Ls1 and Ls2, and the parasitic resistors Rp1 and Rp2 shown in the drawing can be effectively reduced, thus the application frequency of the coated film resistor reaches stable high-frequency features.

Moreover, under the influence of inner parasitic components, the resistors in high-frequency circuits generate the so-called self-resonate frequency response. In general, the lower frequency of the resistance of the resistor is before the self-resonate frequency response, so the stability of the resistor is severely restricted by its self-resonate frequency, and the resistor cannot be used in high-frequency applications. Therefore, the design of resistors for high-frequency applications has to be optimized according to the self-resonate frequency of the resistor. As far as the physical characteristics of high-frequency components are concerned, the larger the parasitic components are, the lower the self-resonate frequency of the high-frequency components will be. Therefore, when an embedded resistor is designed, the design with over large parasitic capacitors/inductors shall be avoided, such that over low self-resonate frequency is avoided.

In the multi-layer circuit board structure with the film resistor design according to the embodiment of the present invention, the smallest resistive electrode structure is applied in the resistive material, and the electrodes are led out in the center of the electrodes through vias to obtain smaller parasitic components. By varying the distance between the electrodes, different resistances can be designed, without particularly changing the areas of the electrodes and the resistive material, thus the embedded resistors with high self-resonate frequency can be obtained.

Figure 6:
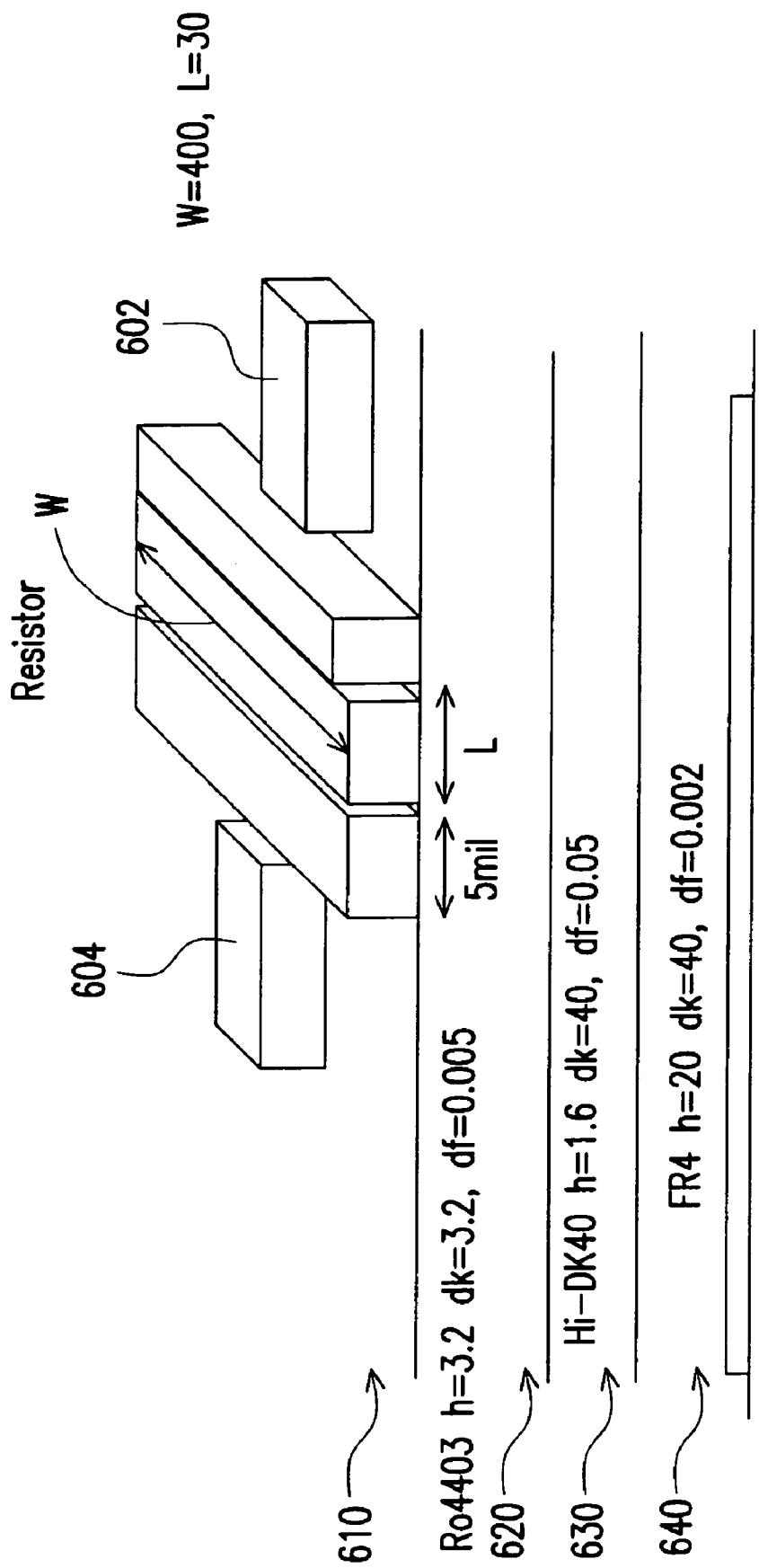
FIG. 6 is a schematic view of a high-frequency resistor structure with the resistance of 50 Ohms.

Referring to FIG. 6, a high-frequency resistor of 50 Ohms is provided in this embodiment. First, the conductivity coefficient (about 29.4 S/m) of the coated resistive material is introduced into the high-frequency simulation software, wherein the substrate structure is as shown in the drawing, and the copper thickness of individual structural layers 610~640 is 0.7 mil, and the thickness of the resistive material is 2 mil. As for Ro4403 shown in the drawing, the material thickness (h) is 3.2 mil, the dielectric constant (dk) is 3.2, and the dispersion factor (df) is 0.005. The minimum area of the process of coating the resistive material is a square having the size of 30 mil×30 mil. If a layer of the resistive material is coated between two electrodes according to the conventional resistor design modes, the structure of the 50 Ohms resistor must have a width W of 400 mil and a length L of 30 mil, according to the calculation of the software. As W is long and narrow in this structure, the parasitic capacitance between the resistor and the ground is too great, causing the decrease of the high-frequency resistance.

Figure 7:
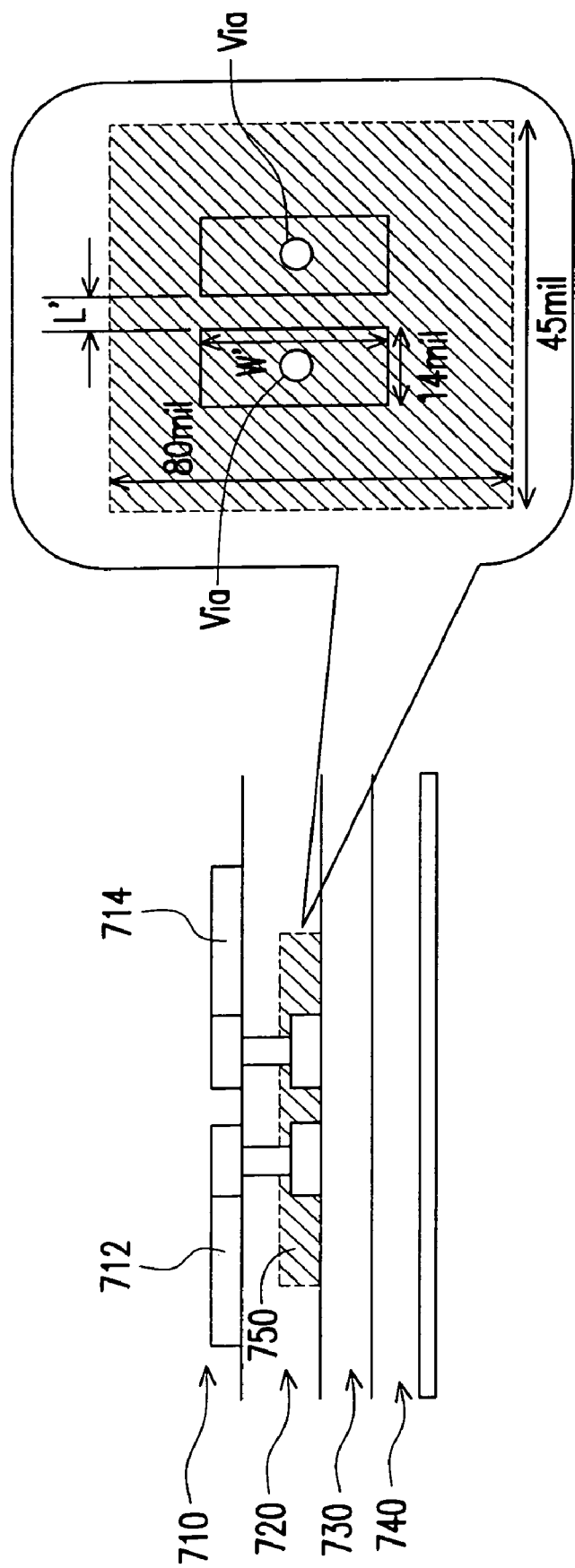
FIG. 7 is a schematic view of an embodiment with the film resistor design structure according to the present invention.

As shown in FIG. 7, to obtain an embedded film resistor with the resistance of 50 Ohms, the multi-layer circuit board structure with the film resistor design according to the embodiment of the present invention only needs to be designed to have the length L' of the minimum wire distance (4 mil) in the printed circuit board (PCB) process. And the width W' of this structure only needs to be 45 mil to obtain the design of the resistance of 50 Ohms. It is known from this drawing that the two electrodes of the film resistor are disposed near the geometric center of the dual-electrode film resistor 750, and are respectively connected to any other conductive layer through two vias.

Figure 8:
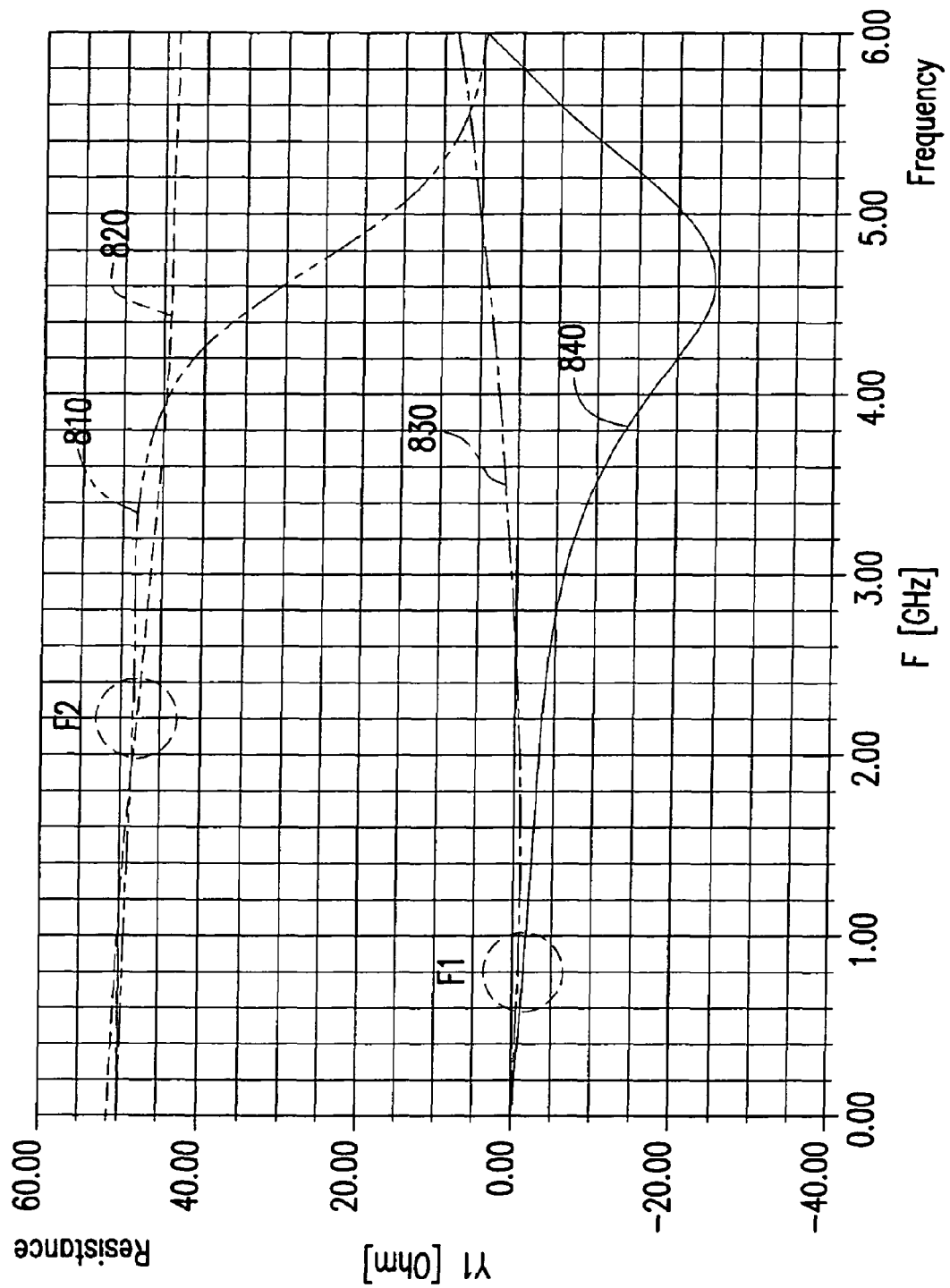
FIG. 8 is a relationship diagram between the frequency and the resistance of the simulation results of two structures of FIGS. 6 and 7.

The simulation results of the two structures of FIGS. 6 and 7 are presented in FIG. 8, as can be seen that the resistor structure according to the embodiment of the present invention shown in FIG. 7 does not have obvious resistance drop within 6 GHz, and the curve of the frequency and the resistance is marked by numeral 820. However, as known from the simulation result of the conventional resistor structure shown in FIG. 6, the resistance (Re[Z]) is influenced by the parasitic capacitive reactance (Im[Z]) and drops significantly at the frequency of 4.7 GHz, and the curve of the frequency and the resistance is indicated by numeral 810. When the frequency is 4.7 GHz, the parasitic capacitive reactance (Im[Z]) of the conventional resistor structure drops, as shown by the curve indicated by numeral 840, while the parasitic capacitive reactance (Im[Z]) of the present invention does not have obvious change, as shown by the curve marked by numeral 830. Therefore, it is understood that the structure of the present invention avoids the resistance error caused by the defect of untrimmed edges of the resistive material, and it is inferred from the simulation result that this structure can effectively reduce the parasitic components, thus increasing the applicable frequency band of the resistor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An embedded film resistor applicable for a multi-layer circuit board, the embedded film resistor comprising:
    a resistive material area comprised of a resistive material, disposed on a layer among the multi-layer circuit board; and
    a first electrode and a second electrode, disposed in the resistive material area and more adjacent to a geometric center of the resistive material area rather than to a peripheral edge of the resistive material area, and covered by the resistive material, wherein each of the first electrode and the second electrode is electrically connected to a metal layer of the multi-layer circuit board.

2. The embedded film resistor as claimed in claim 1, wherein the first electrode and the second electrode are symmetrically disposed in a center area of the resistive material area.

3. The embedded film resistor as claimed in claim 1, wherein the first electrode and the second electrode each has a via led out at a center of the resistive electrodes, for connecting to any other metal layer.

4. The embedded film resistor as claimed in claim 3, wherein each of the first electrode and the second electrode is led out at the center of the resistive electrode via a through hole, and respectively connected to any other metal layer.

5. The embedded film resistor as claimed in claim 1, wherein the first electrode and the second electrode are symmetric one to another relative to the center of the resistive material.

6. The embedded film resistor as claimed in claim 1, wherein the first electrode and the second electrode are juxtaposed in the resistive material.

7. A multi-layer structure, comprising a plurality of layers, wherein one of the layers has an embedded film resistor, and the embedded film resistor comprises:

a resistive material area, comprised of a resistive material, disposed on the layer; and a first electrode and a second electrode, disposed in the resistive material area of the layer and more adjacent to a geometric center of the resistive material area rather than to a peripheral edge of the resistive material area, and covered by the resistive material, wherein each of the first electrode and the second electrode is electrically connected to another one of the layers.

8. The multi-layer structure as claimed in claim 7, wherein the first electrode and the second electrode are symmetrically disposed in a center area of the resistive material area.

9. The multi-layer structure as claimed in claim 7, wherein the first electrode and the second electrode each has a via led out at a center of the resistive electrode, for connecting to one of the layers.

10. The multi-layer structure as claimed in claim 9, wherein each of the first electrode and the second electrode is led out at the center of the resistive electrode via a through hole, for connecting to any metal layer of the layers, and the through hole passes through the multi-layer structure.

11. The multi-layer structure as claimed in claim 7, wherein the first electrode and the second electrode are symmetric one to another relative to the geometric center of the resistive material.

12. The multi-layer structure as claimed in claim 7, wherein the first electrode and the second electrode are juxtaposed in the resistive material.

13. A method of manufacturing an embedded film resistor applicable for a multi-layer circuit board, comprising:
    forming a first electrode and a second electrode on a substrate layer of the multi-layer circuit board;
    coating a resistive material in the substrate layer to form a resistive material area, wherein the resistive material covers the first electrode and the second electrode, and the first electrode and the second electrode are positioned more adjacent to a geometric center of the resistive material area rather than to a peripheral edge of the resistive material area; and
    forming at least two bores to respectively expose the first electrode and the second electrode, and filling a conductive material in the bores to respectively connect the first electrode and the second electrode to any metal layer of other substrate layers of the multi-layer circuit layer.

14. The method of manufacturing an embedded film resistor as claimed in claim 13, wherein the first electrode and the second electrode are connected to any metal layer of the substrate layers via a through hole, and the through hole passes through the multi-layer substrate.

15. The embedded film resistor as claimed in claim 14, wherein the first electrode and the second electrode are symmetric one to another relative to the geometric center of the resistive material.

16. The embedded film resistor as claimed in claim 14, wherein the first electrode and the second electrode are juxtaposed in the resistive material.

17. The embedded film resistor as claimed in claim 14, wherein the first electrode and the second electrode are symmetrically disposed in a center area of the resistive material area.

18. An embedded film resistor applicable for a multi-layer circuit board, the embedded film resistor comprising:

a resistive material area comprised of a resistive material, disposed on a layer among the multi-layer circuit board; and a first electrode and a second electrode, substantially symmetrically juxtaposed in the resistive material area and more adjacent to a geometric center of the resistive material area rather than to a peripheral edge of the resistive material area, and covered by the resistive material, wherein both of the first electrode and the second electrode are respectively connecting to any other metal layer.

19. A method of manufacturing an embedded film resistor applicable for a multi-layer circuit board, comprising:
    forming a first electrode and a second electrode on one substrate layer among the multi-layer circuit board;
    coating a resistive material in the substrate layer to form a resistive material area, wherein the resistive material covers the first electrode and the second electrode, and the first electrode and the second electrode are positioned near a geometric center of the resistive material area relative to two opposite longitudinal ends of the resistive material area, wherein the first electrode and the second electrode are substantially in bilateral symmetry about the geometric center; and
    forming at least two bores to respectively expose the first electrode and the second electrode, and filling a conductive material in the bores to respectively connect to any metal layer of other substrate layers of the multi-layer circuit layer.

20. An embedded film resistor applicable for a multi-layer circuit board, the embedded film resistor comprising:
    a resistive material area comprised of a resistive material, disposed on a layer among the multi-layer circuit board; and
    a first electrode and a second electrode, substantially symmetrically juxtaposed in the resistive material area, wherein the first electrode and the second electrode are positioned more adjacent to a geometric center of the resistive material than to two opposite longitudinal ends of the resistive material area, and are covered by the resistive material, wherein both of the first electrode and the second electrode are respectively connecting to any other metal layer.

21. An embedded film resistor applicable for a multi-layer circuit board, the multi-layer circuit board comprising a top layer, a bottom layer, and a plurality of intermediate layers positioned between the top layer and the bottom layer, the embedded film resistor comprising:
    a resistive material area comprised of a resistive material, disposed on one of the intermediate layers; and
    a first electrode and a second electrode, disposed in the resistive material area, wherein the first electrode and the second electrode are positioned more adjacent to a geometric center of the resistive material area rather than to a peripheral edge of the resistive material area and covered by the resistive material, wherein each of the first electrode and the second electrode is electrically connected to another one of the intermediate layers of the multi-layer circuit board.

* * * * *